US006177490B1

United States Patent
Yoda et al.

(12)

(10) Patent No.: US 6,177,490 B1
(45) Date of Patent: Jan. 23, 2001

(54) LIQUID THERMOSETTING FILLING COMPOSITION AND METHOD FOR PERMANENTLY FILLING HOLES IN PRINTED CIRCUIT BOARD BY THE USE THEREOF

(75) Inventors: Kyoichi Yoda, Ageo; Akio Sekimoto, Tsurugashima; Norio Kimura, Kawagoe; Masashi Sugita, Higashimatsuyama; Masao Arima, Sakado, all of (JP)

(73) Assignee: Taiyo Ink Manufacturing Co., Ltd., Tokyo (JP)

( * ) Notice: Under 35 U.S.C. 154(b), the term of this patent shall be extended for 0 days.

(21) Appl. No.: 09/222,347

(22) Filed: Dec. 29, 1998

(30) Foreign Application Priority Data

Jan. 7, 1998 (JP) .................................................. 10-011990

(51) Int. Cl.[7] .............................. C08K 5/00; C08L 63/00
(52) U.S. Cl. ......................... 523/457; 523/458; 523/459; 523/466
(58) Field of Search .................................... 523/457, 458, 523/459, 466

(56) References Cited

U.S. PATENT DOCUMENTS 5,854,315 * 12/1998 Wu et al. .............................. 523/427

FOREIGN PATENT DOCUMENTS 8-157561   6/1996   (JP) ........................................... 59/32

* cited by examiner

Primary Examiner—Edward J. Cain
(74) Attorney, Agent, or Firm—Ronald P. Kananen; Rader, Fishman & Grauer

(57) ABSTRACT

A liquid thermosetting filling composition comprising (A) an epoxy resin assuming a liquid state at room temperature, (B) a phenolic resin assuming a liquid state at room temperature, (C) a curing catalyst, and (D) an inorganic filler is useful as an ink for permanently filling such holes as via holes and through holes in printed circuit boards of a multilayer board or a double-sided board, a sealing compound for IC packages, and the like. This composition is a two-stage thermally curing type. In a method for permanently filling holes in a printed circuit board, the composition is applied to the board so as to fill the holes in the printed circuit board and precured by application of heat. The parts of the precured composition protruding from a surface defining the holes is removed by polishing and then the precured composition is further heated to cause final curing thereof.

8 Claims, No Drawings

LIQUID THERMOSETTING FILLING COMPOSITION AND METHOD FOR PERMANENTLY FILLING HOLES IN PRINTED CIRCUIT BOARD BY THE USE THEREOF

BACKGROUND OF THE INVENTION

1. Field of the Invention

This invention relates to a liquid thermosetting filling composition or filler grade composition which is useful as an ink for permanently filling such holes as via holes and through holes in printed circuit boards of a multilayer board or a double-sided board, a sealing compound for IC packages, and the like. This invention further relates to a method for permanently filling holes in printed circuit boards by the use of the composition mentioned above.

2. Description of the Prior Art

In recent years, in the surface mounting of electronic parts on the printed circuit boards, the electronic parts used thereon have been shifting from discrete parts to IC and LSI parts and the IC packages have been shifting from the dual inline package (DIP) type to the flat pack type. In terms of the mode of mounting, the parts have been also shifting on a large scale from the aggregate of function blocks to those of hybrid IC's and further to those having a large number of pins separated at a fine pitch. In consequence of these changes, the printed circuit boards have been advancing toward decreasing the width of pattern lines and contracting mounting area.

Further, with a view to coping with the trend of portable devices toward decreasing size and increasing function, the desirability of producing printed circuit boards in further decreased weight and size has been finding growing recognition. As a result, the printed circuit boards are advancing in the direction of favoring the build-up process which comprises superposing insulating layers one each on the upper and the lower surface of a core member, forming necessary circuits thereon, further repeating the superposition of insulating layers and the formation of circuits, and so on and the mounted parts are advancing in the direction of favoring such an area array type as, for example, the ball grid array (BGA) and the land grid array (LGA).

In the circumstances, the desirability of developing a liquid filling ink to be used in permanently filling via holes in boards such as, for example, inner via holes (IVH) in build-up grade core members, surface via holes (SVH) in built-up insulating layers, and via holes in boards for BGA and LGA and consequently producing hardened fillers excellent in physical properties such as polishability and other characteristics has been finding universal recognition.

As the ink for permanently filling such holes in printed circuit boards, the epoxy resin compositions of the thermosetting type and the UV/heat-curable type have been heretofore introduced. The thermosetting type effects the reaction of the relevant epoxy resin by virtue of heat and the UV/heat-curable type precures the relevant photosensitive compound through the radical polymerization reaction of the double bond thereof during the course of precure and subsequently completes the thermal curing of the epoxy resin during the course of heating.

The epoxy resin compositions have been finding utility in a wide variety of fields covering electrical insulating materials, FRP (fiber-reinforced plastics) and other similar composite materials, coating materials, and adhesive agents because their hardened products excel in mechanical, electrical, and chemical properties, and exhibit good adhesiveness as well. The same remarks hold good for the epoxy resin composition to be used as the ink for permanently filling holes in printed circuit boards. It has been customary for this ink to use a primary or secondary aromatic amine or acid anhydride as a curing agent and a tertiary amine or imidazole as a catalyst. When an aromatic amine is used, however, the resin composition shrinks largely during the course of thermal curing and the hardened filler eventually formed of the resin composition in a through hole gives birth to a gap between itself and the wall of the through hole or gives rise to voids (empty cavities) in the hardened filler filling the hole. When the epoxy resin composition contains a solvent, since the solvent vaporizes while the resin composition is being thermally cured, the hardened filler formed of the resin composition in the through hole has the problem of caving in or cissing. Still another epoxy resin curing system suffers the curing reaction thereof to terminate so instantaneously on account of a chain reaction as to permit no easy control. The resultant hardened filler has so high hardness that it may not be easily polished or cut to a flat surface.

The UV/heat-curable type epoxy resin composition is capable of being precured by being exposed to an ultraviolet light. Since the radical polymerization of the double bond of the photosensitive compound included in the composition such as, for example, acrylate proceeds more quickly in the surface part than in the inner part of the composition, the degree with which the composition is photocured varies in the surface part and the inner part thereof and the shrinkage which the composition sustains during the course of thermal curing is large. Further, the resultant hardened composition possesses hygroscopicity and suffers from the drawback of failing to acquire electrical insulation properties and PCT (pressure cooker treatment) resistance sufficiently.

As respects the curing system which combines an epoxy resin with a phenolic resin, though having no bearing on an ink intended for permanently filling holes in printed circuit boards, published Japanese Patent Application, KOKAI (Early Publication) No. 8-157,561 discloses a semiconductor sealing epoxy resin composition characterized by containing a solid epoxy resin of a specific structure including at least one hydrocarbon group in a benzene ring in combination with an imidazole compound of a specific structure. In this published specification is cited a typical composition using a solid epoxy resin and a solid phenolic resin. The sealing resin which is obtained from this composition exhibits satisfactory special qualities and physical properties after it has been hardened. The composition nevertheless is deficient in the ability to be coated as by screen printing or roll coating because the epoxy resin and the phenolic resin which are raw materials are both in a powdery state. This semiconductor sealing epoxy resin composition, therefore, has not yet found actual adoption as a filling material for via holes in printed circuit boards due to its poor workability and productivity.

SUMMARY OF THE INVENTION

The primary object of the present invention, therefore, is to provide a liquid thermosetting filling composition which shrinks only sparingly during the course of thermal curing and ultimately forms a hardened filler showing low hygroscopicity and fully satisfactory fastness of adhesion, producing virtually no voluminal expansion under the conditions of high temperature and high humidity, and excelling in PCT resistance.

A further object of the present invention is to provide a two-stage thermally curing type liquid filling composition which allows easy filling of holes in printed circuit boards by the conventional technique such as, for example, the screen printing process or roll coating process, enables the reaction thereof proceeding during the course of thermal curing to be arbitrarily controlled, can be precured and forms after the precure a hardened filler capable of being easily deprived of an unnecessary part by physical polishing, and proves particularly suitable as an ink for permanently filling holes in printed circuit boards.

Another object of the present invention is to provide a method for permanently filling holes in a printed circuit board, which method enables the holes in the printed circuit board to be filled with high operational and productional efficiency and produces in the holes hardened fillers excellent in both special qualities and physical properties.

To accomplish the objects mentioned above, the present invention provides a liquid thermosetting filling composition which is characterized by containing (A) an epoxy resin which is in a liquid state at room temperature, (B) a phenolic resin which is in a liquid state at room temperature, (C) a curing catalyst, and (D) an inorganic filler.

In a preferred embodiment, the compounding ratio of the epoxy resin (A) and the phenolic resin (B) is such that the epoxy group of the epoxy resin (A) accounts for a proportion in the range of 0.8 to 3.0 equivalent weights per one equivalent weight of the phenolic hydroxyl group of the phenolic resin (B). The compounding ratio of the inorganic filler (D) is preferred to be in the range of 40 to 90% by weight of the total weight of the composition.

The expression "liquid at room temperature" as used in this specification is synonymous with "liquid at the temperature existing at the time of working" and the expression "room temperature" refers to the room temperature during the working time (when preparing the composition or using it) which is generally in the range of about 0° C. to about 30° C.

Further, the present invention provides a method for permanently filling a hole in a printed circuit board, which is characterized by comprising the steps of filling the hole in the printed circuit board with such a liquid thermosetting filling composition as mentioned above, heating the composition filling the hole thereby effecting precure of the composition, polishing and removing the part of the precured composition which protrudes from the surface terminating the hole, and further heating the precured composition till final curing.

DETAILED DESCRIPTION OF THE INVENTION

The thermosetting filling composition of the present invention is characterized by using (A) an epoxy resin and (B) a phenolic resin which are both in a liquid state at room temperature in combination with (C) a curing catalyst and (D) an inorganic filler.

Specifically, the first feature of the composition of the present invention consists in using the epoxy resin and the phenolic resin which are both in a liquid state at room temperature and, owing thereto, assuming the ability to liquefy either without using a diluting solvent capable of inducing voluminal shrinkage of the composition after the step of heating or using the solvent in an extremely small proportion, and enabling holes such as, for example, via holes in a printed circuit board to be filled by the known and commonly utilized technique such as, for example, the screen printing process or roll coating process.

The second feature thereof consists in utilizing the thermally curing reaction of the epoxy resin and the phenolic resin. Since this reaction system is the addition reaction of an epoxy group and a phenolic hydroxyl group, even when this reaction is suspended while the action of curing is in process, this action can be resumed by application of heat and allowed to proceed till final curing (finishing curing or postcuring). Thus, the composition allows the two-stage curing of itself to be attained by application of heat and permits the step of removing an unnecessary part of the surface of the hardened composition to be carried out after the precure and, therefore, enables the unnecessary part of the precured composition which is in a relatively soft state to be very easily polished and removed by physical polishing.

The third feature thereof consists in the fact that the precured product of the epoxy resin and the phenolic resin shrinks only slightly during the course of final curing as compared with the product which is obtained when the conventional UV/heat-curable type composition is precured by the radical polymerization of the double bond of the photosensitive compound included therein and also the fact that the finally cured product enjoys low hygroscopicity and excellent fastness of adhesion, possesses a small linear expansion coefficient, and shows a small voluminal expansion.

Further, since the epoxy resin and the phenolic resin to be used in the composition of the present invention are both in a liquid state at room temperature, the inorganic filler which is required for the purpose of imparting low expansibility to the hardened composition can be incorporated in the composition in a large amount, namely at a ratio of not less than 40% by weight based on the total weight of the composition, either without using a diluting solvent or using the solvent in an extremely small proportion. As a result, the shrinkage which is caused by the influence of the vaporization of the volatile component during the course of thermal curing can be repressed. The composition, therefore, shrinks only slightly during the course of final curing and allows ultimate formation of a hardened product which enjoys low hygroscopicity and excellent fastness of adhesion, possesses a small linear expansion coefficient, shows lower water absorption and smaller voluminal expansion under the conditions of high temperature and high humidity, and excels in PCT resistance.

By using the composition of the present invention, therefore, it is made possible to fill such holes as via holes and through holes in printed circuit boards with high operational efficiency and produce printed circuit boards of highly reliable performance with high productivity.

Now, the constituent components of the liquid thermosetting filling composition of the present invention will be described in detail below.

First, the epoxy resin (A) specified above can be any of the epoxy resins which fulfill the sole requirement that they be in a liquid state at room temperature. As concrete examples of the epoxy resin, epoxy resins of various species represented by the bisphenol A type, bisphenol F type, bisphenol S type, phenol novolak type, and cresol novolak type may be cited. The epoxy resins of these species may be used either singly or in the form of a combination of two or more members, depending on the requirement for improving the special qualities of a coating film to be obtained.

An epoxy resin which is in a solid state at room temperature may be used in combination with the aforementioned epoxy resin which is in the liquid state at room temperature in such a proportion as avoids impairing the effect of the present invention. The proportion of the epoxy resin assuming the solid state at room temperature is preferred to be not more than 20% by weight based on the total amount of the epoxy resins.

Next, the phenolic resin (B) specified above can be any of the phenolic resins which fulfill the sole requirement that they be in a liquid state at room temperature. As concrete examples of the phenolic resin, phenolic resins of various species represented by the bisphenol A type, bisphenol F type, novolak type, resol type, modified bisphenol A types such as, for example, allylated bisphenol A type, and the modified bisphenol F types such as, for example, the allylated bisphenol F type may be cited. The phenolic resins of these species may be used either singly or in the form of a combination of two or more members.

A phenolic resin which is in a solid state at room temperature may be used in combination with the aforementioned phenolic resin which is in the liquid state at room temperature in such a proportion as avoids impairing the effect of the present invention. The proportion of the phenolic resin assuming the solid state at room temperature is preferred to be not more than 20% by weight based on the total amount of the phenolic resins.

The compounding ratio of the epoxy resin (A) and the phenolic resin (B) is preferred to be such that the epoxy group of the epoxy resin may account for a proportion in the range of 0.8 to 3.0 equivalent weights per one equivalent weight of the phenolic hydroxyl group of the phenolic resin. If the proportion is less than 0.8 equivalent weight, the shortage will make the resultant hardened product offer insufficient water resistance, acquire no sufficiently low hygroscopicity, betray deficiency in polishability and fastness of adhesion, and suffer an undue increase in the linear expansion coefficient. Conversely, if this proportion exceeds 3.0 equivalent weights, the excess will be at a disadvantage in strengthening the anionically polymerizing property of the epoxy resin through the medium of an imidazole catalyst and preventing the composition from acquiring the two-stage thermally curing property. More preferably, the compounding ratio is such that the proportion of the epoxy group may be in the range of 1.2 to 2.0 equivalent weights per one equivalent weight of the phenolic hydroxyl group.

The curing catalyst (C) specified above can be any of the curing catalysts which fulfill the requirement that they be effective in promoting the addition reaction of an epoxy group and a phenolic hydroxyl group. As concrete examples of the curing catalyst, imidazoles represented by commercial products sold under the codes of 2E4MZ, C11Z, C17Z, and 2PZ, azine compounds of imidazoles represented by commercial products sold under the codes of 2MZ-AZINE and 2E4MZ-AZINE, isocyanurates of imidazoles represented by commercial products sold under the codes of 2MZ-OK and 2PZ-OK, and imidazole hydroxymethyl compounds represented by commercial products sold under the codes of 2PHZ and 2P4MHZ (the aforementioned commercial products invariably made by Shikoku Kasei Kogyo Co., Ltd.), dicyandiamide and derivatives thereof, melamine and derivatives thereof, diaminomaleonitrile and derivatives thereof, amines such as diethylene triamine, triethylene tetramine, tetramethylene pentamine, bis(hexamethylene) triamine, triethanol amine, diaminodiphenyl methane, and organic acid hydrazides, 1,8-diazabicyclo[5.4.0]undecene-7 (made by Sun-Apro K.K. and sold under the product code of "DBU"), 3,9-bis(3-aminopropyl)-2,4,8,10-tetraoxaspiro [5.5]undecane (made by Ajinomoto Co., Inc. and sold under the product code of "ATU"), and organic phosphine compounds such as triphenyl phosphine, tricyclohexyl phosphine, tributyl phosphine, and methyl diphenyl phosphine may be cited. These curing catalysts may be used either singly or in the form of a combination of two or more members, depending on the requirement for improving the special qualities of a coating film to be aimed at. In the curing catalysts of this class, dicyandiamide, melamine, guanamine and derivatives thereof such as acetoguanamine, benzoguanamine, and 3,9-bis[2-(3,5-diamino-2,4,6-triazaphenyl)-ethyl]-2,4,8,10-tetraoxaspiro[5.5]undecane, and organic acid salts and epoxy adducts of these compounds are known to possess the ability to adhere fast to copper and the ability to rustproof copper and are capable of not only functioning as a curing agent for the epoxy resin but also contributing to the protection of the copper of a printed circuit board against discoloration and, therefore, are advantageously usable.

The amount of the curing catalyst (C) to be incorporated in the composition has only to suffice the standard quantitative proportion. It is proper, for example, to be not less than 0.1 part by weight and not more than 10 parts by weight, based on the total amount of the epoxy resin (A) and the phenolic resin (B) taken as 100 parts by weight.

Then, the inorganic filler (D) specified above can be any of the substances which are used as the standard fillers for resin. As concrete examples of the inorganic filler, extenders such as silica, precipitated barium sulfate, talc, calcium carbonate, silicon nitride, and aluminum nitride and metallic powders of copper, tin, zinc, nickel, silver, palladium, aluminum, iron, cobalt, gold, platinum, etc. may be cited. These inorganic fillers may be used either singly or in the form of a combination of two or more members, depending on the requirement for improving the special qualities of a coating film to be aimed at. Among other inorganic fillers mentioned above, silica proves to be particularly excellent in low hygroscopicity and low voluminal expansibility. While the silica may be fused silica, crystalline silica, or the mixture thereof, spherical fuzed silica is preferred over the other species of silica by reason of a high filling property. The incorporation of metallic particles into the composition is effective in further improving the high filling property and in imparting the thermal conductivity to the composition. The inorganic filler is preferred to have an average particle diameter in the range of 3 to 25 $\mu$m. If the average particle diameter is less than 3 $\mu$m, the filler will manifest only a small effect in repressing the linear expansion coefficient of the hardened product of the composition. Conversely, if the average particle diameter exceeds 25 $\mu$m, the composition will be at a disadvantage in acquiring a defoaming property and a high filling property with difficulty.

The amount of the inorganic filler (D) to be incorporated in the composition is preferred to account for a proportion in the range of 40 to 90% by weight of the total weight of the composition. If this proportion is less than 40% by weight, the shortage will prevent the hardened product from exhibiting sufficiently low expansibility and cause it to suffer from deficiency in polishability and fastness of adhesion.

Conversely, if the proportion exceeds 90% by weight, the excess will allow no easy conversion of the composition into a liquid paste and prevent the composition from acquiring the printability or the ability to fill holes. More preferably, the proportion is in the range of 55 to 75% by weight.

Though the composition of the present invention does not always require to use a diluting solvent because it uses the epoxy resin and the phenolic resin which are both in a liquid state, it may incorporate a diluting solvent for the purpose of adjusting the viscosity of itself. The proportion of the diluting solvent is preferred to be not more than 10% by weight based on the total weight of the composition. If it exceeds 10% by weight, the excess will cause an unduly large increase in the shrinkage of the composition under the influence of the vaporization of the volatile component during the course of heating. More preferably, the proportion is not more than 5% by weight. No incorporation of the diluting solvent proves to be most favorable.

Examples of the diluting solvents include, but are not limited to: ketones such as methyl ethyl ketone and cyclohexanone; aromatic hydrocarbons such as toluene, xylene, and tetramethyl benzene; glycol ethers such as methyl cellosolve, butyl cellosolve, methyl carbitol, butyl carbitol, propylene glycol monomethyl ether, dipropylene glycol monoethyl ether, and triethylene glycol monoethyl ether; esters such as ethyl acetate, butyl acetate, and acetates of glycol ethers mentioned above; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha.

The composition of the present invention, when necessary, may further incorporate therein any of known and commonly used coloring agents such as phthalocyanine blue, phthalocyanine green, iodine green, disazo yellow, crystal violet, titanium oxide, carbon black, and naphthalene black which are used in ordinary screen printing grade resist inks, any of known and commonly used thermal polymerization inhibitors such as hydroquinone, hydroquinone monomethyl ether, tert-butyl catechol, pyrogallol, and phenothiazine which are used for imparting the stability needed during storage, any of known and commonly used thickening agent or thixotropic agent such as clay, kaolin, organobentonite, and montmorillonite, silicone type, fluorine type, or macromolecular type anti-foaming agent and/or leveling agent, adhesiveness imparting agent such as imidazole-based compound, thiazole-based compound, triazole-based compound, and silane coupling agent, or any other known and commonly used additives.

The liquid thermosetting filling composition of the present invention which is obtained as described above can be made to fill via holes in printed circuit boards by the use of such a conventional technique as, for example, the screen printing process, curtain coating process, spray coating process, or roll coating process.

Subsequently, the composition presently filling the via holes in the printed circuit boards is heated for the sake of precuring at a temperature in the approximate range of 90° to 130° C. for a period in the approximate range of 30 to 90 minutes. Since the resultant precured composition has relatively low hardness, the unnecessary parts thereof which protrude from the surfaces of the board can be easily removed along flat planes included in the surfaces by physical polishing. Thereafter, the precured composition is again heated for the sake of final curing (postcuring or finish curing) at a temperature in the approximate range of 140° to 180° C. for a period in the approximate range of 30 to 90 minutes. Since the hardened composition hardly expands or shrinks owing to its low expansibility, it ultimately forms a finished product which enjoys a satisfactory dimensional stability and excels in low hygroscopicity, fastness of adhesion, and electrical insulation properties. The hardness of the precured composition mentioned above can be controlled by varying the heating time and the heating temperature used for the precuring.

Owing to such excellent special qualities as mentioned above, the composition of the present invention can be advantageously used not only for the ink intended for permanently filling holes in printed circuit boards but also for other applications such as, for example, the sealing material for IC packages.

Now, the present invention will be described specifically below with reference to working examples and a comparative example. The word "parts" mentioned below refers invariably to "parts by weight" unless otherwise specified.

EXAMPLE 1

A thermosetting composition intended as an ink for permanently filling holes in a substrate was obtained by mixing preparatorily 24.0 parts of a liquid bisphenol A type epoxy resin (epoxy equivalent weight=190; made by Yuka Shell Epoxy K.K. and sold under the trademark designation of "EPIKOTE" 828), 16.0 parts of a liquid bisphenol A type resin (phenolic hydroxyl group equivalent weight=114), 50.0 parts of silica (made by Tatsumori K.K. and sold under the trademark designation of "Crystalite" 5x), 2.0 parts of a curing catalyst (made by Shikoku Kasei Kogyo Co., Ltd. and sold under the trademark designation of "CUREZOL" 2PHZ), and 2.0 parts of diethylene glycol monoethyl ether (made by the Dow Chemical Company and sold under the trademark designation of "DAWANOL" DPM) and kneading the resultant mixture with a three-roll mill.

EXAMPLE 2

A thermosetting composition intended as an ink for permanently filling holes in a substrate was obtained by faithfully following the procedure of Example 1 while changing the amount of the liquid bisphenol A type epoxy resin (trademark designation "EPIKOTE" 828) to 28.0 parts and that of the liquid bisphenol A type resin to 12.0 parts.

EXAMPLE 3

A thermosetting composition intended as an ink for permanently filling holes in a substrate was obtained by faithfully following the procedure of Example 1 while using 13.0 parts of a liquid bisphenol A type epoxy resin ("EPIKOTE" 828) and 12.0 parts of a liquid bisphenol F type epoxy resin (epoxy equivalent weight=170; made by Yuka Shell Epoxy K.K. and sold under the trademark designation of "EPIKOTE" 807) in the place of 24.0 parts of the liquid bisphenol A type epoxy resin ("EPIKOTE" 828) and changing the amount of the liquid bisphenol A type resin to 14.0 parts.

EXAMPLE 4

A thermosetting composition intended as an ink for permanently filling holes in a substrate was obtained by faithfully following the procedure of Example 1 while using a liquid bisphenol F type epoxy resin ("EPIKOTE" 807) in the place of the liquid bisphenol A type epoxy resin ("EPIKOTE" 828).

EXAMPLE 5

A thermosetting composition intended as an ink for permanently filling holes in a substrate was obtained by faithfully following the procedure of Example 1 while changing the amount of the liquid bisphenol A type epoxy resin ("EPIKOTE" 828) to 26.0 parts, that of the liquid bisphenol A type resin to 14.0 parts, and that of the silica to 40.0 parts.

EXAMPLE 6

A thermosetting composition intended as an ink for permanently filling holes in a substrate was obtained by faithfully following the procedure of Example 5 while changing the amount of the silica to 60.0 parts.

EXAMPLE 7

A thermosetting composition intended as an ink for permanently filling holes in a substrate was obtained by faithfully following the procedure of Example 5 while changing the amount of the silica to 70.0 parts.

EXAMPLE 8

A thermosetting composition intended as an ink for permanently filling holes in a substrate was obtained by faithfully following the procedure of Example 5 while using 60.0 parts of silica ("Crystalite" 5x) and 10.0 parts of a copper powder (made by Mitsui Kinzoku K.K. and sold under the product code of Cu Fine Powder #1110) in the place of 40.0 parts of the silica ("Crystalite" 5x).

EXAMPLE 9

A thermosetting composition intended as an ink for permanently filling holes in a substrate was obtained by faithfully following the procedure of Example 8 while changing the amount of the silica to 50.0 parts and that of the copper powder to 20.0 parts.

COMPARATIVE EXAMPLE 1

A thermosetting composition intended as an ink for permanently filling holes in a substrate was obtained by faithfully following the procedure of Example 1 while changing the amount of the liquid bisphenol A type epoxy resin ("EPIKOTE" 828) to 40.0 parts and omitting the incorporation of the liquid bisphenol A type resin.

The compositions obtained in Examples 1–9 and Comparative Example 1 are shown collectively in Table 1 below.

TABLE 1

| Components | Example | | | | | | | | | Comparative |
|---|---|---|---|---|---|---|---|---|---|---|
| (parts by weight) | 1 | 2 | 3 | 4 | 5 | 6 | 7 | 8 | 9 | Example 1 |
| EPIKOTE 828 | 24.0 | 28.0 | 13.0 | — | 26.0 | 26.0 | 26.0 | 26.0 | 26.0 | 40.0 |
| EPIKOTE 807 | — | — | 12.0 | 24.0 | — | — | — | — | — | — |
| Liquid bisphenol A type resin | 16.0 | 12.0 | 14.0 | 16.0 | 14.0 | 14.0 | 14.0 | 14.0 | 14.0 | — |
| Silica | 50.0 | 50.0 | 50.0 | 50.0 | 40.0 | 60.0 | 70.0 | 60.0 | 50.0 | 50.0 |
| Copper powder | — | — | — | — | — | — | — | 10.0 | 20.0 | — |
| 2PHZ | 2.0 | 2.0 | 2.0 | 2.0 | 2.0 | 2.0 | 2.0 | 2.0 | 2.0 | 2.0 |
| DPM | 2.0 | 2.0 | 2.0 | 2.0 | 2.0 | 2.0 | 2.0 | 2.0 | 2.0 | 2.0 |

Remarks
EPIKOTE 828: Liquid bisphenol A type epoxy resin made by Yuka Shell Epoxy K.K.
EPIKOTE 807: Liquid bisphenol F type epoxy resin made by Yuka Shell Epoxy K.K.
2PHZ: Curing catalyst made by Shikoku Kasei Kogyo Co., Ltd. and sold under the trademark designation of "CUREZOL" 2PHZ
DPM: Diethylene glycol monoethyl ether made by the Dow Chemical Company and sold under the trademark designation of "DAWANOL" DPM The thermosetting compositions obtained by the procedures of Examples 1–9 and Comparative Example 1, each intended as an ink for permanently filling holes in a substrate, were subjected to the following tests. The results are shown in Table 2 below.

TABLE 2

| Special qualities | Example | | | | | | | | | Comparative |
|---|---|---|---|---|---|---|---|---|---|---|
|  | 1 | 2 | 3 | 4 | 5 | 6 | 7 | 8 | 9 | Example 1 |
| Polishability | ◯ | ◯ | ◯ | ◯ | ◯ | ◯ | ◯ | ◯ | ◯ | × |
| Shrinkability | ◯ | ◯ | ◯ | ◯ | ◯ | ◯ | ◯ | ◯ | ◯ | Δ |
| Fastness of adhesion | ◯ | ◯ | ◯ | ◯ | ◯ | ◯ | ◯ | ◯ | ◯ | Δ |
| Water absorption (%) | 0.55 | 0.45 | 0.50 | 0.60 | 0.55 | 0.45 | 0.45 | 0.45 | 0.45 | 0.75 |
| Voluminal expansion | ◯ | ◯ | ◯ | ◯ | ◯ | ◯ | ◯ | ◯ | ◯ | Δ |
| Glass transition point (° C.) | 140 | 150 | 140 | 130 | 145 | 150 | 150 | 150 | 150 | 165 |
| Linear expansion coefficient ($\alpha_1 \times 10^{-6}$) | 40 | 30 | 35 | 40 | 40 | 30 | 25 | 25 | 25 | 50 |

TABLE 2-continued

|  | Example |  |  |  |  |  |  |  |  | Comparative |
|---|---|---|---|---|---|---|---|---|---|---|
| Special qualities | 1 | 2 | 3 | 4 | 5 | 6 | 7 | 8 | 9 | Example 1 |
| Linear expansion coefficient ($\alpha_2 \times 10^{-6}$) | 110 | 90 | 105 | 110 | 105 | 95 | 90 | 90 | 85 | 110 |
| Thermal conductivity (W/m · K) | 0.60 | 0.60 | 0.60 | 0.60 | 0.57 | 0.63 | 0.65 | 0.80 | 0.95 | 0.60 |

Polishability:

On glass-epoxy resin substrates having plated through holes formed in advance therein by panel plating, the inks of Examples 1–9 and Comparative Example 1 intended for permanently filling holes were applied by the screen printing method to fill the through holes. The resultant substrates were then placed in a hot air circulating drying oven and heated therein at 120° C. for one hour by way of precuring to obtain test samples (I). The test samples (I) were physically polished with a buffing device to rate the ease with which the unnecessary parts of the precured products were removed on the following three-point scale.

○: Polishable with ease
Δ: Polishable with certain difficulty
×: Not polishable

Shrinkability:

The test samples (I) were physically polished with a buffing device to remove unnecessary parts of the precured products filling the holes along the planes included in the surfaces of the substrates. The samples thus polished were placed in a hot air circulating drying oven and heated therein at 150° C. for one hour by way of final curing to obtain test samples (II) and rate the ratio of shrinkage by the final curing on the following three-point scale.

○: No shrinkage by curing
Δ: Only slight change observed
×: Conspicuous shrinkage observed Fastness of adhesion:

The test samples (II) mentioned above were rated for fastness of adhesion thereof to the walls of copper-plated through holes on the following three-point scale.

○: Absolutely no separation observed
Δ: Only slight separation observed
×: Separation clearly observed Water absorption:

The inks of Examples 1–9 and Comparative Example 1 intended for permanently filling holes were applied by the screen printing method to glass sheets of known weights. The glass sheets covered with the inks were heated in a hot air circulating drying oven at 120° C. for one hour by way of precuring, left cooling, and heated at 150° C. for one hour by way of final curing to obtain test samples (III). The test samples (III) were cooled to room temperature and then weighed. Subsequently, the test samples (III) were treated in a pressure cooker under the conditions of 121° C., 100% R.H., and the treating time of 24 hours and weighed to find the weights of the hardened products. The water absorption of the hardened products were calculated by the following equation:

$$\text{Water absorption} = \frac{W_2 - W_1}{W_1 - W_g}$$

where $W_1$ is the weight of the test sample (III), $W_2$ is the weight of the test sample (III) after the PCT (pressure cooker treatment), and $W_g$ is the weight of the glass sheet used.

Voluminal expansion:

The test samples (II) mentioned above were treated in a pressure cooker under the conditions of 121° C., 100% R.H., and the treating time of 24 hours to rate the ratios of expansion caused on the hardened products by the pressure cooker treatment on the following three-point scale.

○: No voluminal expansion
Δ: Only slight change observed
×: Conspicuous expansion observed Glass transition point:

The inks of Examples 1–9 and Comparative Example 1 intended for permanently filling holes were applied by the screen printing method to Teflon (a trademark of E.I. du Pont de Nemours & Co. for polytetrafluoroethylene) sheets washed with water and dried in advance. The sheets covered with the inks were heated in a hot air circulating drying oven at 120° C. for one hour by way of precuring, left cooling, and heated at 150° C. for one hour by way of final curing. They were cooled to room temperature and the hardened films were separated from the Teflon sheets to obtain test samples (IV). The test samples (IV) were tested for glass transition point by the TMA method.

Linear expansion coefficients ($\alpha_1$, $\alpha_2$)

The test samples (IV) were tested for linear expansion coefficient by the TMA method to determine the linear expansion coefficient $\alpha_1$ before the glass transition point and the linear expansion coefficient $\alpha_2$ after the glass transition point.

Thermal conductivity:

Using the diffusivity of heat "a", specific heat "c", and specific gravity "ρ" taken from measurement, the thermal conductivity of each of the test samples (IV) (hardened films) was calculated by the following equation.

$$\text{Thermal conductivity}[W/m\cdot K] = a[cm^2/s] \times c[J/g\cdot K] \times \rho[g/cm^3] \times 100$$

EXAMPLE 10

A liquid bisphenol A type epoxy resin ("EPIKOTE" 828), a liquid bisphenol A type resin, silica ("Crystalite" 5x), a curing catalyst ("CUREZOL" 2PHZ), and diethylene glycol monoethyl ether ("DAWANOL" DPM) were preparatorily mixed at varying compounding ratios shown in Table 3 below and kneaded with a three-roll mill to obtain thermosetting compositions, i.e. inks A, B, and C for permanently filling holes in a substrate.

The inks thus obtained were subjected to the same various tests as mentioned above. The results are shown additionally in Table 3 below.

TABLE 3

| Components (parts by weight) and special qualities | A | B | C |
|---|---|---|---|
| EPIKOTE 828 | 26.0 | 10.0 | 26.0 |
| Liquid bisphenol A type resin | 14.0 | 30.0 | 14.0 |

TABLE 3-continued

| Components (parts by weight) and special qualities | A | B | C |
|---|---|---|---|
| Silica | 50.0 | 50.0 | 10.0 |
| 2PHZ | 2.0 | 2.0 | 2.0 |
| DPM | 2.0 | 2.0 | 2.0 |
| Polishability | ○ | Δ | Δ |
| Shrinkability | ○ | ○ | × |
| Fastness of adhesion | ○ | Δ | Δ |
| Water absorption (%) | 0.50 | 1.2 | 0.80 |
| Voluminal expansion | ○ | ○ | Δ |
| Glass transition point (° C.) | 145 | 95 | 125 |
| Linear expansion coefficient ($\alpha_1 \times 10^{-6}$) | 35 | 85 | 60 |
| Linear expansion coefficient ($\alpha_2 \times 10^{-6}$) | 100 | 250 | 150 |

It is clearly noted from the results shown in Table 3 that the hardened product obtained from the ink having an unduly small compounding ratio of the liquid epoxy resin to the liquid phenolic resin (ink B) showed an increase in the water absorption, betrayed deficiency in the polishability and the fastness of adhesion, and suffered from unduly high linear expansion coefficients, whereas hardened product obtained from the ink having an unduly small compounding ratio of the silica (ink C) showed a large shrinkage during the course of final curing and betrayed deficiency in the polishability and the fastness of adhesion.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A liquid thermosetting filling composition, comprising:
   (A) an epoxy resin assuming a liquid state at room temperature, said epoxy resin being at least one member selected from the group consisting of bisphenol A type epoxy resin, bisphenol F type epoxy resin, bisphenol S type epoxy resin, phenol novolak type epoxy resin and cresol novolak epoxy resin,
   (B) a phenolic resin assuming a liquid state at room temperature,
   (C) a curing catalyst, and
   (D) an extender.

2. The composition according to claim 1, further comprising a metallic powder.

3. The composition according to claim 1, wherein the compounding ratio of said epoxy resin (A) and said phenolic resin (B) is such that the epoxy group of said epoxy resin (A) accounts for a proportion in the range of 0.8 to 3.0 equivalent weights per one equivalent weight of the phenolic hydroxyl group of said phenolic resin (B).

4. The composition according to claim 1, wherein said inorganic filler (D) is present in an amount of 40 to 90% by weight, based on the total weight of the composition.

5. The composition according to claim 1, further comprising a diluting solvent in an amount of not more than 10% by weight, based on the total weight of the composition.

6. The composition according to claim 1, further comprising at least one additive selected from the group consisting of a coloring agent, a thermal polymerization inhibitor, a thickening agent, an anti-foaming agent, a leveling agent, and a coupling agent.

7. A method for permanently filling a hole in a printed circuit board, comprising the steps of:
   filling the hole in said printed circuit board with a liquid thermosetting filling composition set forth in claim 1,
   heating the composition filled in said hole for precuring the composition,
   removing by polishing a part of the precured composition protruding from a surface defining said hole, and
   further heating the precured composition to cause final curing thereof.

8. The method according to claim 7, wherein said precuring step is carried out at a temperature in the approximate range of 90° to 130° C. for a period in the approximate range of 30 to 90 minutes and said final curing step is carried out at a temperature in the approximate range of 140° to 180° C. for a period in the approximate range of 30 to 90 minutes.

* * * * *